United States Patent [19]

Park

[11] Patent Number: 5,541,136
[45] Date of Patent: Jul. 30, 1996

[54] METHOD OF FORMING A FIELD OXIDE FILM IN A SEMICONDUCTOR DEVICE

[75] Inventor: Sang H. Park, Kyungki-Do, Rep. of Korea

[73] Assignee: Hyundai Electronics Industries Co., Ltd., Kyungki-Do, Rep. of Korea

[21] Appl. No.: 498,912

[22] Filed: Jul. 6, 1995

[30] Foreign Application Priority Data

Jul. 6, 1994 [KR] Rep. of Korea ................. 1994/16088
Jul. 6, 1994 [KR] Rep. of Korea ................. 1994/16110

[51] Int. Cl.$^6$ ................................................. H01L 21/76
[52] U.S. Cl. .............................. 437/69; 437/89; 437/90; 437/70; 437/72; 437/73; 437/67
[58] Field of Search ............................... 437/69, 70, 72, 437/73, 67, 89, 90; 148/DIG. 50

[56] References Cited

U.S. PATENT DOCUMENTS

| | | | |
|---|---|---|---|
| 4,566,914 | 1/1986 | Hall | 437/89 |
| 4,597,164 | 7/1986 | Havemann . | |
| 5,100,830 | 3/1992 | Morita | 437/69 |
| 5,236,863 | 8/1993 | Iranmanesh | 437/90 |

FOREIGN PATENT DOCUMENTS 0043663  2/1992  Japan ................................. 437/72

*Primary Examiner*—Trung Dang
*Attorney, Agent, or Firm*—Fish & Richardson P.C.

[57] ABSTRACT

The present invention discloses a method of forming a field oxide film of a semiconductor device which can minimize a bird's beak by etching a predetermined portion of a silicon substrate, forming a field oxide film and forming a single crystal silicon layer on the etched silicon substrate.

14 Claims, 4 Drawing Sheets

(PRIOR ART) FIG. 1
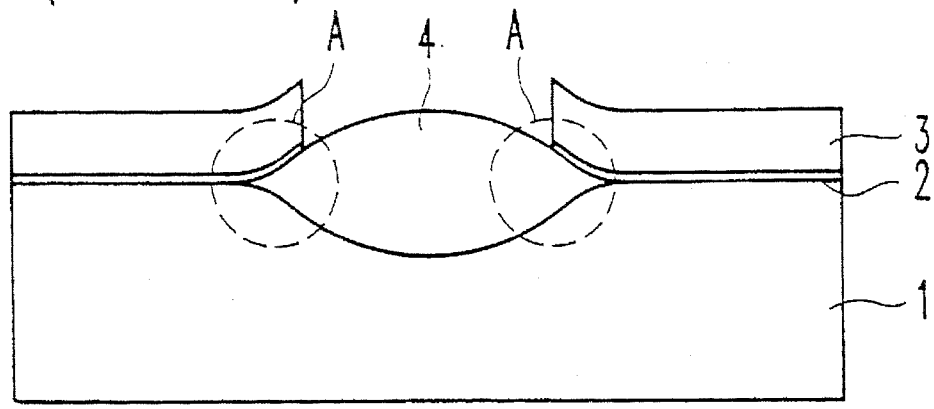
FIG. 2A
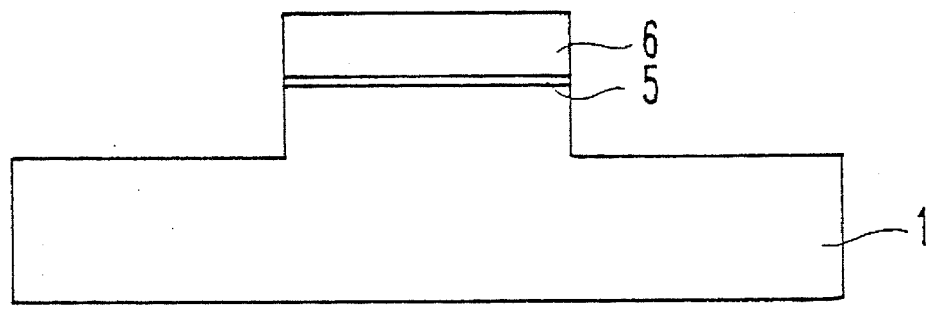
FIG. 2B
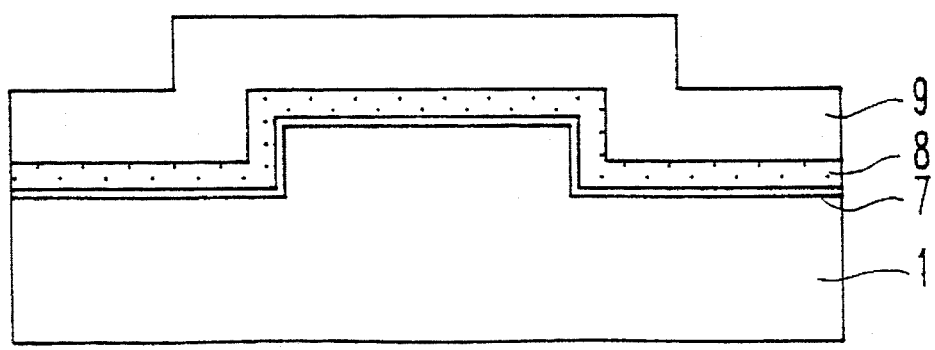

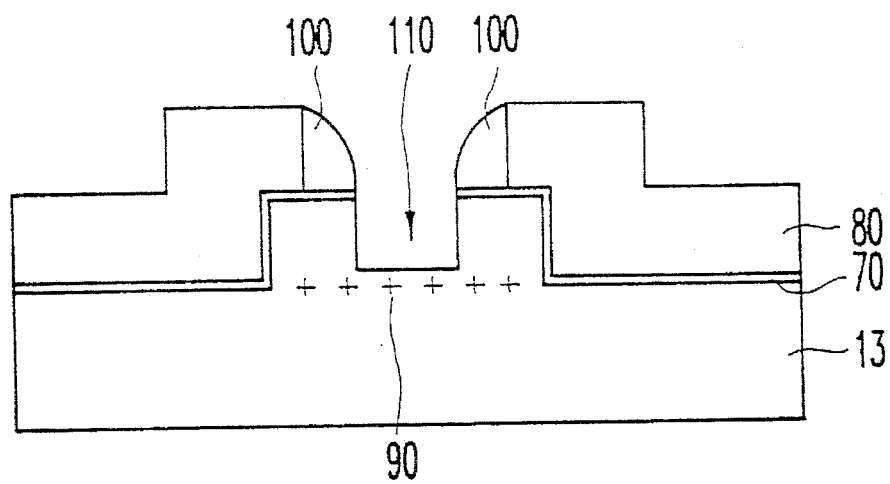
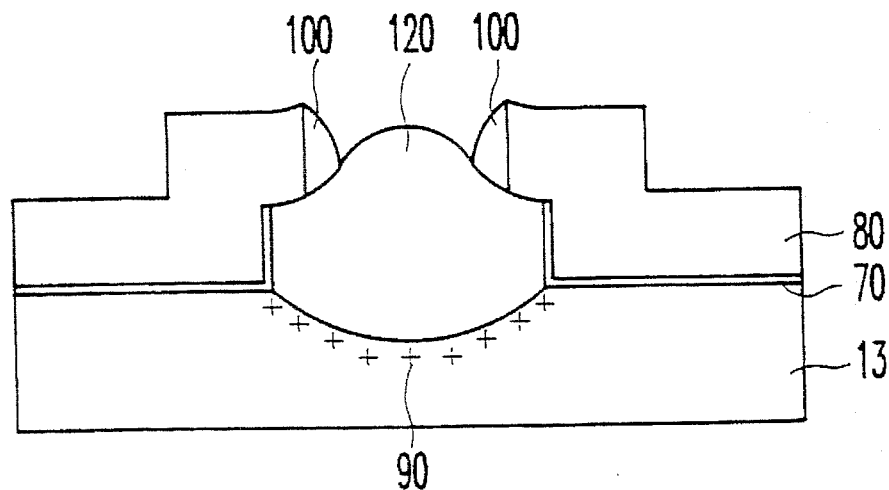
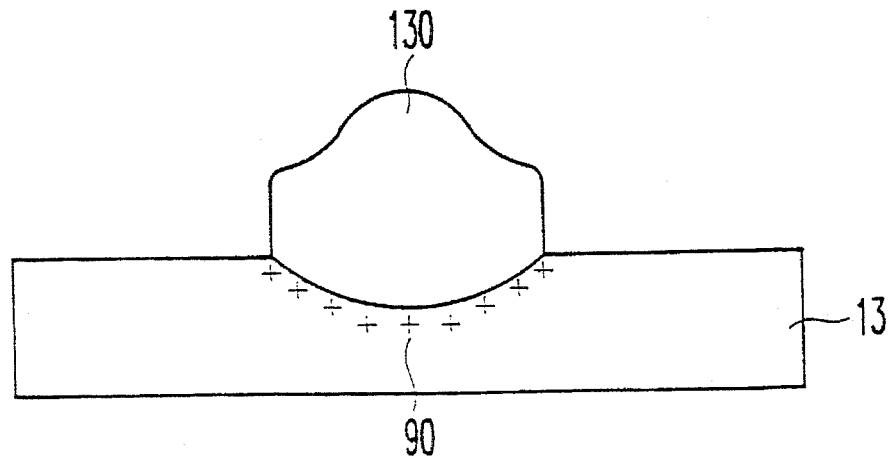

METHOD OF FORMING A FIELD OXIDE FILM IN A SEMICONDUCTOR DEVICE

BACKGROUND OF INVENTION

1. Field of the Invention

The present invention relates to a method of forming a field oxide film in a semiconductor device, and particularly, to a method of forming a field oxide film of semiconductor device which can increase an active region by removing a bird's beak produced by a selective thermal oxidization process.

2. Information Disclosure Statement

In general, a field oxide film is formed to isolate semiconductor devices from each other. A prior art method of forming a field oxide film is described below with reference to FIG. 1.

A field oxide film 4 composed of a thermal oxide film is formed by sequentially forming a pad oxide film 2 and a nitride film 3 on a silicon substrate 1, thereafter etching a selected part of the pad oxide film 2 and the nitride film 3, and thereafter performing a thermal oxidization process. The prior art technology has a disadvantage in that the active region is decreased by the occurence of a bird's beak "A" as the thermal oxide film penetrates below the nitride film 3.

SUMMARY OF THE INVENTION

Therefore, an object of the present invention is to provide a method of forming a field oxide film of a semiconductor device which can improve the topology between the field oxide film and the silicon substrate by minimizing the bird's beak at the time of forming the field oxide film.

To achieve the above object a method of forming a field oxide film according to a first embodiment of the present invention is proposed, comprising the steps of:

forming a first thermal oxide film on a silicon substrate and forming a photoresist pattern thereon, and then removing a portion of exposed the first thermal oxide film and silicon substrate; removing the first thermal oxide film and photoresist pattern and sequentially forming a second thermal oxide film, a polysilicon film and a nitride film on the resulting structure after removing the first thermal oxide film and photoresist pattern; exposing the polysilicon film by removing a portion of the nitride film, and then forming a channel stopper on the silicon substrate; forming a filed oxide film by performing a thermal oxidization process; and removing the nitride film, polysilicon film and second thermal oxide film, and then forming a single crystal silicon layer on the exposed silicon substrate.

a method of forming a field oxide film according to a second embodiment of the present invention also is proposed, comprising the steps of:

forming a photoresist pattern on a silicon substrate, and then removing a portion of exposed the silicon substrate; removing the photoresist pattern and sequentially forming a second thermal oxide film, a polysilicon film and a nitride film on the resulting structure after removing the photoresist; exposing the polysilicon film by removing a portion of the nitride film, and then forming a channel stopper on the silicon substrate; forming a field oxide film by performing a thermal oxidization process; and removing the nitride film, polysilicon film and second thermal oxide film and then forming a single crystal silicon layer on the exposed silicon substrate.

BRIEF DESCRIPTION OF THE DRAWINGS

To better understand the nature and object of the present invention, reference should be made to the following detailed descriptions taken in conjunction with the accompanying drawings in which:

FIG. 1 is a sectional view of a semiconductor device illustrating a prior art method of forming a field oxide film;

FIGS. 2A through 2E are sectional views of a semiconductor device illustrating a method of forming a field oxide film of a first embodiment of the present invention; and FIGS. 3A through 3F are sectional views of a semiconductor device illustrating a method of forming a field oxide film of a second embodiment of the present invention.

Similar reference characters refer to similar parts through the several views of the drawings.

DETAILED DESCRIPTION OF THE INVENTION

Figure 2C:
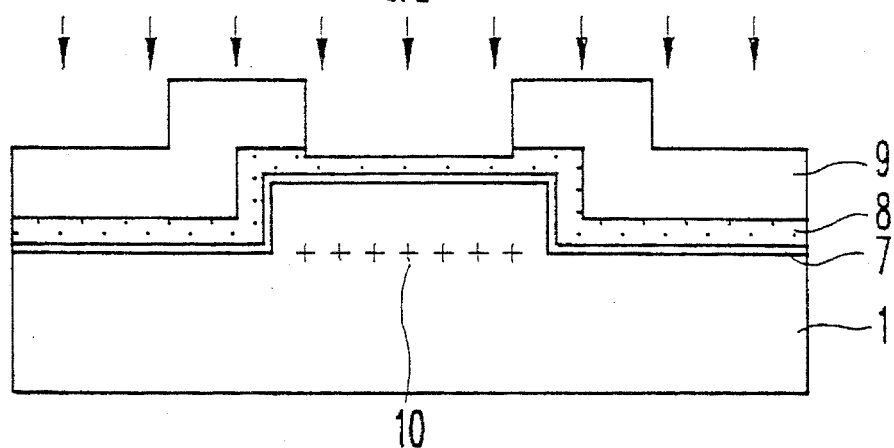

FIG. 1 is a sectional view of a semiconductor device illustrating a prior art method of forming a field oxide film and is discussed above.

FIGS. 2A through 2E are sectional views of a semiconductor device illustrating a method of forming a field oxide film of a first embodiment of the present invention.

Referring to FIG. 2A, a first thermal oxide film 5 is formed with the thickness of 100 to 300Å on the silicon substrate 1, and thereafter, a photoresist pattern 6 is formed thereon. The first thermal oxide film 5 and silicon substrate 1 exposed by the photoresist pattern 6 are removed to a predetermined depth by an anisotropic etching process. HF or a buffer oxide film etching solution can be used at the time of removing the first thermal oxide film 5.

Referring to FIG. 2B, after the photoresist pattern and the first thermal oxide film 6 and 5 are removed, a second thermal oxide film 7, a polysilicon film 8 and nitride film 9 are sequentially formed.

Referring to FIG. 2C, a portion of the nitride film 9 is removed by a photo etching process thereby exposing a part of the polysilicon film 8. A channel stopper 10 is formed by successively implanting $BF_2$ ions.

Figure 2D:
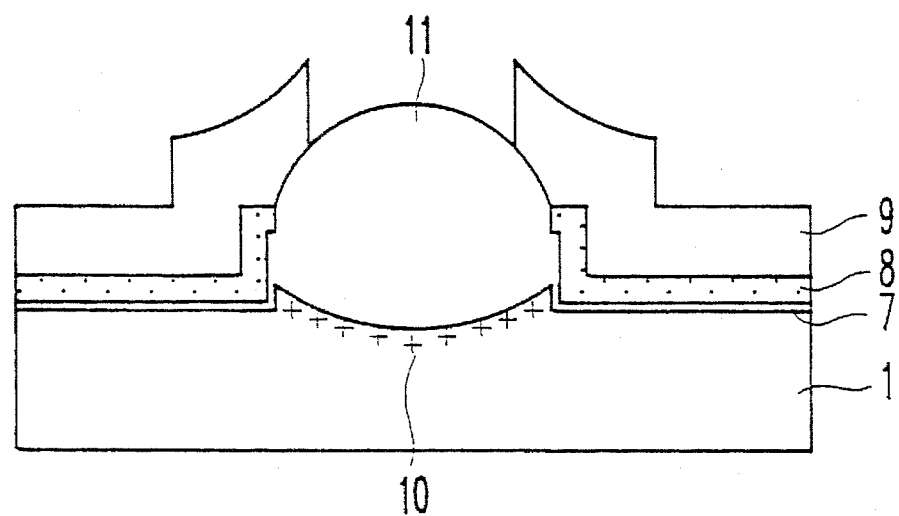

FIG. 2D is a sectional view showing a condition in which a field oxide film 11 is formed without a bird's beak by performing a thermal oxidization process in a condition shown in FIG. 2C.

Figure 2E:
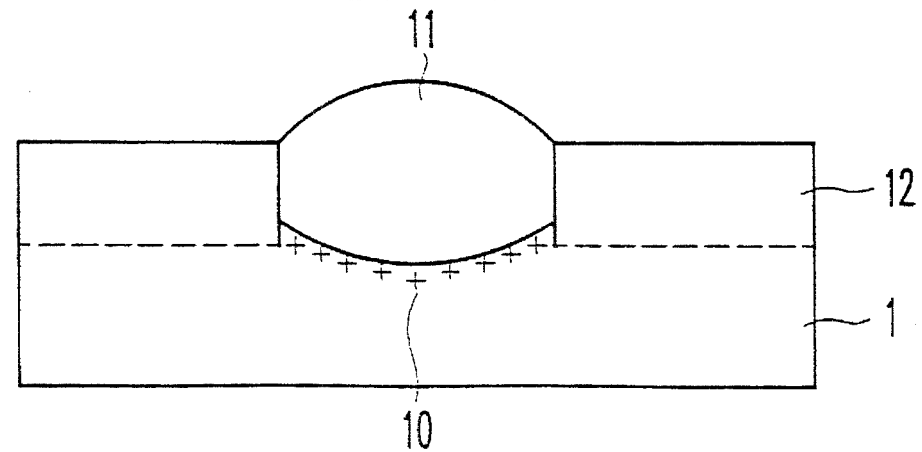

FIG. 2E is a sectional view showing a condition in which a single crystal silicon layer 12 is formed on the silicon substrate 1 by removing the nitride film 9, polysilicon film 8 and the second thermal oxide film 7 by a wet etching process and thereafter performing an epitaxial process in a condition shown in FIG. 2D. Phosphoric acid at the temperature of 150° C. can be used at the time of wet etching the nitride film 9, and a chemical solution containing HF and $HNO_3$ can be used at the time of wet etching the polysilicon film 8.

The same effect can be obtained by not forming the first thermal oxide film 5 and by forming a predetermined photoresist pattern 6 on the silicon substrate 1 and thereafter performing the anisotropic etching process.

FIGS. 3A through 3F are sectional views of a semiconductor device illustrating a method of forming a field oxide film of a second embodiment of the present invention.

Figure 3A:
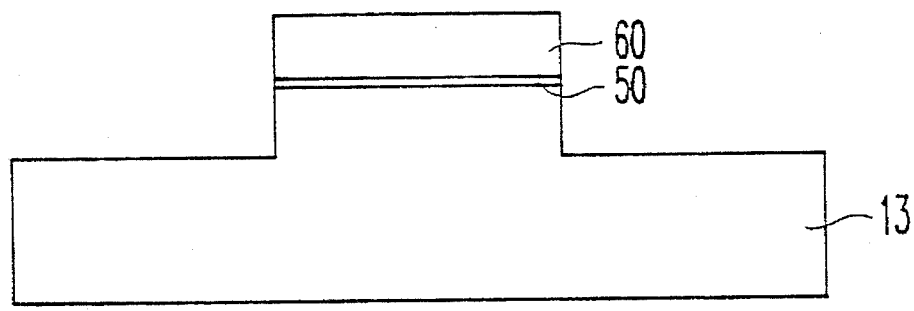

FIG. 3A is a sectional view showing a condition in which a first thermal oxide film 50 is formed with thickness of 100 to 300Å on a silicon substrate 13, and thereafter, a photoresist pattern 60 is formed thereon, and then the first thermal oxide film 50 and silicon substrate 13 exposed by the photoresist pattern 60 are etched to a predetermined depth by the anisotropic etching process.

Figure 3B:
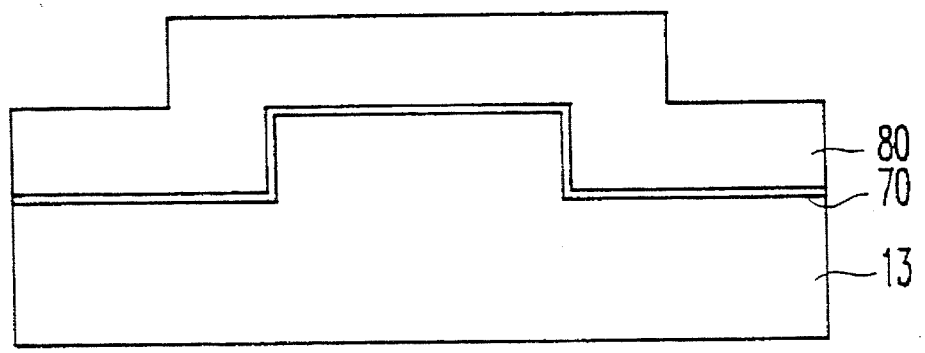

FIG. 3B is a sectional view showing a condition in which the photoresist pattern 60 and the first thermal oxide film 50 are removed and a second thermal oxide film 70 and a first nitride film 80 are sequentially formed with a predetermined thickness.

Figure 3C:
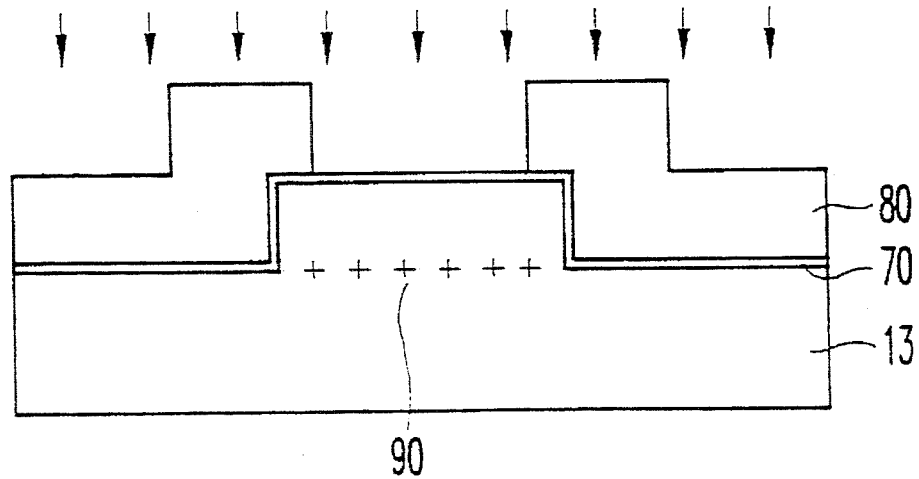

Referring to FIG. 3C, a portion of the first nitride film 80 is removed by the photolithography thereby exposing a portion of the second thermal oxide film 70. Thereafter, a channel stopper 90 is formed by implanting impurity ions on the silicon substrate 13. The impurity ions for forming the channel stopper 90 preferably exist on a projecting portion of the silicon substrate 13.

FIG. 3D is a sectional view showing a condition in which a second nitride film is deposited in a condition shown in FIG. 3C, then a nitride film spacer 100 is formed on a side wall of the first nitride film 80 after anisotropically etching the second nitride film, and then the second thermal oxide film 70 and silicon substrate 13 exposed by utilizing the first nitride film 80 and nitride film spacer 100 as an etching stop layer are removed to a desired depth to form a trench 110. The depth of the trench 110 is preferably smaller than the height of the projecting portion of the silicon substrate 13.

FIG. 3E is a sectional view showing a condition in which a field oxide film 120 is formed without a bird's beak by performing the thermal oxidization process in a condition shown in FIG. 3D.

FIG. 3F is a sectional view showing a condition in which a complete field oxide film 130 is formed by removing the nitride film spacer 100, the first nitride film 80 and the second thermal oxide film 70 by a wet etching process so that the silicon substrate 13 is exposed in a condition shown in FIG. 3E.

As described above, the present invention has an excellent effect in that the electrical characteristics and reliability of a semiconductor device can be improved by increasing the active region by minimizing a bird's beak at the time of forming a field oxide film.

Although this invention has been described in its preferred form with a certain degree of particularity, it is appreciated by those skilled in the art that the present disclosure of the preferred form has been made only as an example and that numerous changes in the details of the construction, combination and arrangement of its parts may be resorted to without departing from the spirit and scope of the invention.

What is claimed is:

1. A method of forming a field oxide film in a semiconductor device, comprising the steps of:

forming a first thermal oxide film on a silicon substrate and forming a photoresist pattern thereon, and then removing a portion of exposed said first thermal oxide film and silicon substrate;

removing said first thermal oxide film and photoresist pattern and sequentially forming a second thermal oxide film, a polysilicon film and a nitride film on the resulting structure after removing said first thermal oxide film and photoresist pattern;

exposing said polysilicon film by removing a portion of said nitride film, and then forming a channel stopper on said silicon substrate;

forming a field oxide film by performing a thermal oxidization process; and removing said nitride film, polysilicon film and second thermal oxide film, and then forming a single crystal silicon layer on said exposed silicon substrate.

2. The method of claim 1, wherein HF or buffer oxide film etching solution is used at the time of removing said first thermal oxide film.

3. The method of claim 1, wherein $BF_2$ ions are implanted for forming said channel stopper.

4. The method of claim 1, wherein said nitride film is removed by a wet etching process which utilizes phosphoric acid.

5. The method of claim 1, wherein said polysilicon film is removed by a wet etching process which utilizes a chemical solution containing HF and $HNO_3$.

6. The method of claim 1, wherein said single crystal silicon layer is formed by an epitaxial process.

7. A method of forming a field oxide film in a semiconductor device, comprising the steps of:

forming a photoresist pattern on a silicon substrate, and then removing a portion of exposed said silicon substrate;

removing said photoresist pattern and sequentially forming a thermal oxide film, a polysilicon film and a nitride film on the resulting structure after removing said photoresist;

exposing said polysilicon film by removing a portion of said nitride film, and then forming a channel stopper on said silicon substrate;

forming a field oxide film by performing a thermal oxidization process; and removing said nitride film, polysilicon film and thermal oxide film and then forming a single crystal silicon layer on said exposed silicon substrate.

8. The method of claim 7, wherein $BF_2$ ions are implanted for forming said channel stopper.

9. The method of claim 7, wherein said nitride film is removed by a wet etching process which utilizes phosphoric acid.

10. The method of claim 7, wherein said polysilicon film is removed by a wet etching process which utilizes a chemical solution containing HF and $HNO_3$.

11. A method of forming a field oxide film in a semiconductor device, comprising the steps of:

forming a first thermal oxide film on a silicon substrate and forming a photoresist pattern thereon, and then removing a portion of exposed said first thermal oxide film and silicon substrate;

removing said first thermal oxide film and photoresist pattern and sequentially forming a second thermal oxide film and a first nitride film;

exposing said second thermal oxide film by removing a portion of said first nitride film, and then forming a channel stopper on said silicon substrate;

forming a trench by forming a nitride film spacer on a side wall of said first nitride film and by removing a portion of said second thermal oxide film and silicon substrate;

forming a field oxide film by a thermal oxidization process; and etching said nitride film spacer, first nitride film and second thermal oxide film.

12. The method of claim 11, wherein impurity ions implanted at the time of forming said channel stopper exist at a projecting portion of said silicon substrate.

13. The method of claim 11, wherein the depth of said trench is formed to be smaller than the height of a projecting portion of said silicon substrate.

14. The method of claim 11, wherein said nitride film spacer, first nitride film and second thermal oxide film are removed by a wet etching process.

* * * * *